(12) United States Patent
Yamaguchi et al.

(10) Patent No.: US 7,508,462 B2
(45) Date of Patent: Mar. 24, 2009

(54) ELECTRO-OPTICAL DEVICE AND ELECTRONIC EQUIPMENT

(75) Inventors: Yuichi Yamaguchi, Kanagawa (JP); Tadahiro Hagita, Kagoshima (JP)

(73) Assignee: Sony Corporation, Tokyo (JP)

( * ) Notice: Subject to any disclaimer, the term of this patent is extended or adjusted under 35 U.S.C. 154(b) by 151 days.

(21) Appl. No.: 11/747,561

(22) Filed: May 11, 2007

(65) Prior Publication Data
US 2007/0257279 A1   Nov. 8, 2007

(51) Int. Cl.
*G02F 1/136* (2006.01)
(52) U.S. Cl. ...................................... 349/43
(58) Field of Classification Search .............. 349/43
See application file for complete search history.

(56) References Cited

U.S. PATENT DOCUMENTS

2005/0285988 A1* 12/2005 Nakagawa .............. 349/44

FOREIGN PATENT DOCUMENTS

| JP | 2004-170909 | 6/2004 |
| JP | 2005-202336 | 7/2005 |
| JP | 2005-222019 | 8/2005 |

* cited by examiner

*Primary Examiner*—David Nelms
*Assistant Examiner*—Phu Vu
(74) *Attorney, Agent, or Firm*—Sonnenschein Nath & Rosenthal LLP

(57) ABSTRACT

An electro-optical device includes: a pair of substrates facing one another across an electro-optical substance layer; and a layered structure formed on one of the substrates, including scanning lines formed in a first direction, data lines formed in a second direction intersecting the first direction, pixel electrodes formed corresponding to the intersections, transistors for controlling switching of the pixel electrodes, storage capacitors electrically connected to the pixel electrodes, and a fixed electrode layer for supplying fixed potential to one electrode of the storage capacitors, the scanning lines, data lines, transistors, and storage capacitors being arrayed within a light shielding region around the pixel electrodes; wherein the pixel electrodes, and a semiconductor layer where the transistors are formed, are electrically connected via an relay electrode layer at the same layer as the fixed electrode layer; and wherein the fixed electrode layer is discontinuous between adjacent data lines in the first direction.

10 Claims, 11 Drawing Sheets

ELECTRO-OPTICAL DEVICE AND ELECTRONIC EQUIPMENT

CROSS REFERENCES TO RELATED APPLICATIONS

The present invention contains subject matter related to Japanese Patent Application JP 2005-145066 filed in the Japanese Patent Office on May 18, 2005, and Japanese Patent Application JP 2005-304048 filed in the Japanese Patent Office on Oct. 19, 2005, the entire contents of which are incorporated herein by reference.

BACKGROUND OF THE INVENTION

1. Field of the Invention

The present invention relates to an electro-optical device using an electro-optical substance such as liquid crystal or the like, and to an electronic device having the same.

2. Description of the Related Art

With known electro-optical devices, wherein an electro-optical substance such as liquid crystal or the like is sandwiched between a pair of substrates, and the optical properties of the liquid crystal or the like is changed by an electric circuit formed upon one of the substrates, so as to perform a display, multiple components are formed on the substrate on which the electric circuit is formed, such as transistors, scanning lines, data lines, pixel electrodes, storage capacitors, a layer for shielding external incident light, and a layer for insulating these electrodes and wires (e.g., see Japanese Unexamined Patent Application Publication No. 2004-170909).

The source electrode of a transistor is electrically connected to a pixel electrode via multiple contact holes formed in an insulating film and a relay electrode layer. Also, a fixed electrode layer for inputting an external common potential is electrically connected to one electrode of a storage capacity formed for holding optical properties of the liquid crystal or the like, via a separate relay electrode layer. The fixed electrode layer is formed in matrix fashion on the one substrate. Each of the pixel electrodes are connected to the fixed layer of pixels in the vertical and horizontal directions, in matrix fashion. It should be noted here that the term "vertical direction" as opposite to "horizontal direction" as used in the present specification does not refer to the thickness direction of the substrate, i.e. to the direction in which the layers are layered, but to one direction on the main face of the substrate.

Also, one of the multiple relay electrode layers connected to the pixel electrodes is formed at the same layer as the fixed electrode layer. Now, two contact holes are formed in the formation region of the relay electrode layer at the same layer as the fixed electrode layer. One of the contact holes is a contact hole for connecting the relay electrode layer to the pixel electrode, and the other is a contact hole for connecting the relay electrode layer to a semiconductor layer of the transistor (drain electrode or source electrode). In this case, the relay electrode layer and the fixed electrode layer are formed at the same layer, so there is the need to electrically separate the two. Accordingly, for the size of each pixel formed on the substrate (i.e., planar dimensions), there is the need to ensure an area of a size large enough to layout at least the area of the relay electrode layer, the area of the two contact holes, and an area for separating the relay electrode layer and fixed electrode layer.

Further, the relay electrode layer directly connected to the pixel electrode connects to the transistor via another relay electrode layer formed at a different layer as this relay electrode layer, and the fixed electrode layer is connected to one electrode forming the storage capacitor via an relay electrode layer at the same layer as the other relay electrode layer mentioned above. Accordingly, there is the need to provide area of a size capable of layout of the relay electrode layers formed in separate layers and area for separating these. Also, the size of the light shielding portion which stipulates the aperture ratio of the pixel is restricted by the size of the above relay electrode layers, the width of the fixed electrode layer, and further the area needed for separating the relay electrode layer and fixed electrode layer.

SUMMARY OF THE INVENTION

With such an electro-optical device, there is demand for a greater pitch of pixels and increased aperture ratio, in order to obtain high image quality. However, with known electro-optical devices such as described above, there is need for space for the matrix-shaped fixed electrode layer, an relay electrode layer at the same layer as this fixed electrode layer, space for electrically separating these, and further, space for separating these from an relay electrode layer at another layer. The necessity for such layout space has hindered realization of greater pitch of pixels and increased aperture ratio. Particularly, around the relay electrode layer directly connecting to the pixel electrodes, there is the need to ensure space for forming contact holes, forming wiring lines of the fixed electrode layer, and further for electrically separation. This means that the area occupied for the layout thereof is great, which has been a major obstacle hindering realization of greater pitch of pixels and increased aperture ratio.

Now, there have been various methods conceived to realize greater pitch of pixels and increased aperture ratio, such as a method for forming one electrode of the storage capacitor in a different layer from the layer in which the transistor is formed, or the scanning line, data line, and fixed electrode layer, or a method for increasing the number of layers of relay electrode layers so as to lay out the relay electrode layers over a greater number of layers. However, these methods are problematic in that the manufacturing process is complicated, leading to decreased yield and so forth.

Accordingly, it has been found desirable to provide an electro-optical device whereby greater pitch of pixels and increased aperture ratio can be realized without complicating the manufacturing process.

According to an embodiment of the present invention, an electro-optical device comprises: an electro-optical substance layer; a pair of substrates facing one another across the electro-optical substance layer so as to sandwich the electro-optical substance layer therebetween; and a layered structure formed on one of the substrates, the layered structure including scanning lines formed in a first direction, data lines formed in a second direction (vertical direction) which intersects the first direction (horizontal direction), pixel electrodes formed corresponding to intersection portions of the scanning lines and the data lines, transistors for controlling switching of the pixel electrodes, storage capacitors electrically connected to the pixel electrodes, and a fixed electrode layer for supplying a fixed potential to one electrode of the storage capacitors, the scanning lines, the data lines, the transistors, and the storage capacitors, being arrayed within a light shielding region around the pixel electrodes; wherein the pixel electrodes and a semiconductor layer where the transistors are formed are electrically connected via a first relay electrode layer at the same layer as the fixed electrode layer and a second relay electrode layer at the same layer as the data lines; and wherein the fixed electrode layer is discontinuous between adjacent data lines in the first direction, with the first relay electrode layer being formed at this discontinuous portion in a separated state from the fixed electrode layer.

With this electro-optical device, the fixed electrode layer is discontinuous between adjacent data lines in the first direction, and the first relay electrode layer is formed at this discontinuous portion in a state separated from the fixed electrode layer, so there is no need to provide an area for layout of the wiring lines of the fixed electrode layer in one (upper) or the other (lower) of the first relay electrode layer in the second direction following the data lines.

According to this electro-optical device, in the layered structure of multi-layered wiring formed on one substrate, the size necessary for layout around the first relay electrode layer can be reduced in the second direction even without increasing the number of relay electrode layers. Accordingly, realization of greater pitch of pixels and increased aperture ratio can be achieved without complicating the manufacturing process.

DESCRIPTION OF THE PREFERRED EMBODIMENTS

First Embodiment

An electro-optical device according to a first embodiment of the present invention will be described in detail with reference to drawings, as a specific embodiment of a case of application to an active matrix liquid crystal display device using a liquid crystal substance as an electro-optical substance, for example. It should be noted though, that this does not mean that the present invention is restricted to application to liquid crystal display devices; rather, the present invention can be broadly applied to electro-optical devices in general which use an electro-optical substance, such as organic EL display devices using organic EL (electro-luminescence) substance as the electro-optical substance, for example.

Other applications thereof include electronic equipment having the above-described electro-optical device, such as televisions, computer monitors, automobile on-board monitors, cellular telephones, portable terminals, cameras with built-in monitors (e.g., video cameras, digital cameras, etc.), touch panels, POS (point-of-sales) terminals, and so forth.

Figure 1:
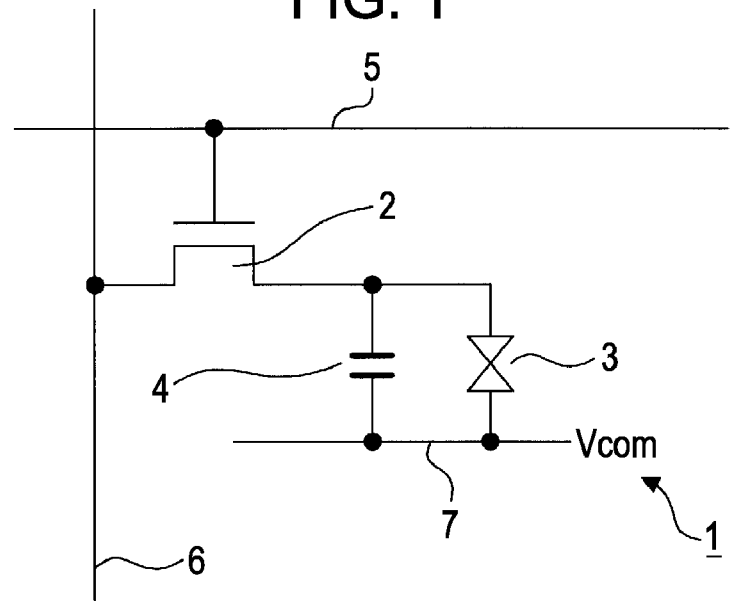
FIG. 1 is a circuit diagram illustrating a configuration example of a pixel circuit of a liquid crystal display device to which a first embodiment of the present invention is applied.

FIG. 1 is a circuit diagram illustrating a configuration example of a pixel circuit in a liquid crystal display device according to the present embodiment. In FIG. 1, pixels 1 are formed in two-dimensional matrix fashion on an unshown liquid crystal display panel. The liquid crystal display panel is formed by sandwiching a liquid crystal substance layer between a pair (i.e., two) substrates. Accordingly, the pair of substrates is disposed such that each of the substrates face one another across the liquid crystal substance layer therebetween. Generally, the pair of substrates is formed of glass substrates having optical transparency. Pixel electrodes are formed on one of the substrates in increments of pixels, and a facing electrode, used in common by all electrodes, is formed on the other substrate facing the one substrate. In the following description, the substrate upon which the pixel electrodes are formed will be referred to as an "array substrate", and the substrate upon which is formed the facing electrode will be referred to as a "facing substrate".

A pixel 1 is configured of a transistor 2, e.g., a TFT (thin-film transistor), a liquid crystal cell 3 where a pixel electrode is connected to the drain electrode of the transistor 2, and a storage capacitor 4 of which one electrode is connected to the drain electrode of the transistor 2. The transistor 2 is for controlling switching of the pixel electrode of the liquid crystal cell 3. The liquid crystal cell 3 functions as a dielectric body between the pixel electrode and the facing electrode, and accordingly equivalently configures liquid crystal capacity CLC. The storage capacitor 4 is electrically connected to the pixel electrode so as to maintain the potential of the signal voltage applied to the pixel electrode of the liquid crystal cell 3.

The gate electrode of the transistor 2 is connected to a scanning line 5. Also, the source electrode of the transistor 23 is connected to a data line 6. Multiple scanning lines 5 are formed in the horizontal direction, which is also called "first direction" here, and multiple data lines 6 are formed in the vertical direction, which is also called "second direction" here, such that the data lines 6 intersect the scanning lines 5. One pixel 1 is formed at each intersection between scanning line 5 and data line 6. The facing electrode of the liquid crystal cell 3 and the other electrode of the storage capacitor 4 are each connected to a common line 7. The common line 7 is from providing a common voltage Vcom, which is common to all pixels, to the facing electrode of the liquid crystal cell 3 and the other electrode of the storage capacitor 4.

Figure 2:
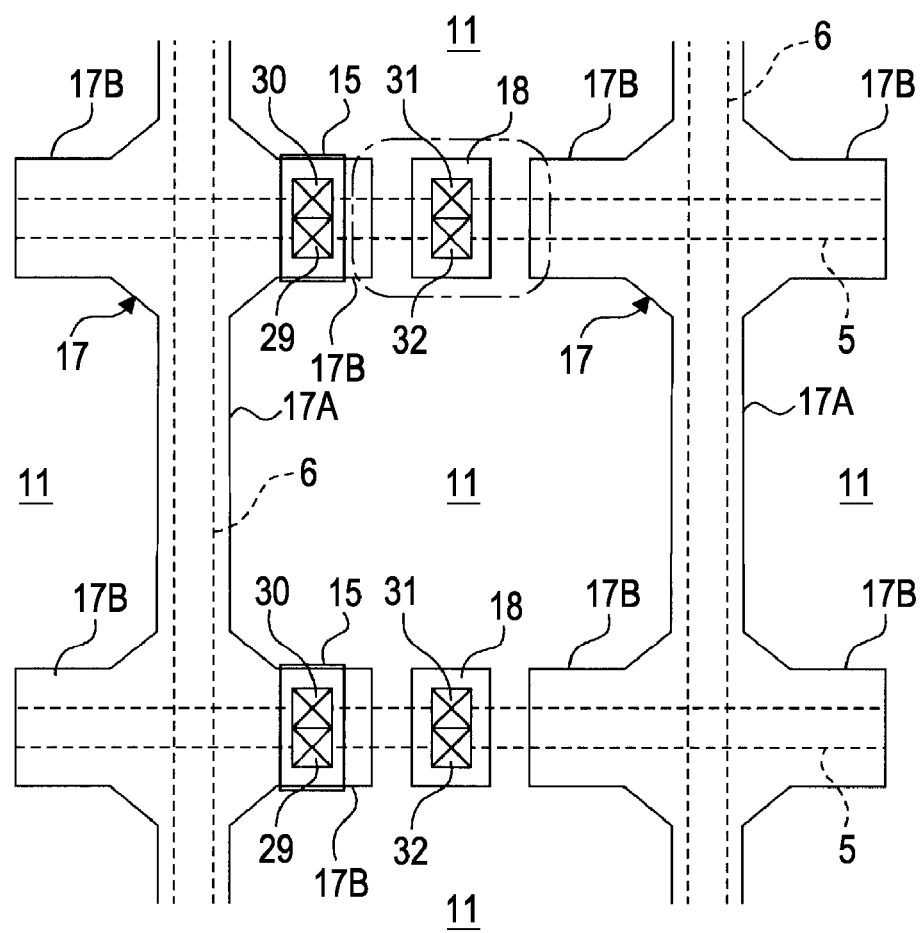
FIG. 2 is a planar layer view of principal components of an array substrate according to the first embodiment.
Figure 3:
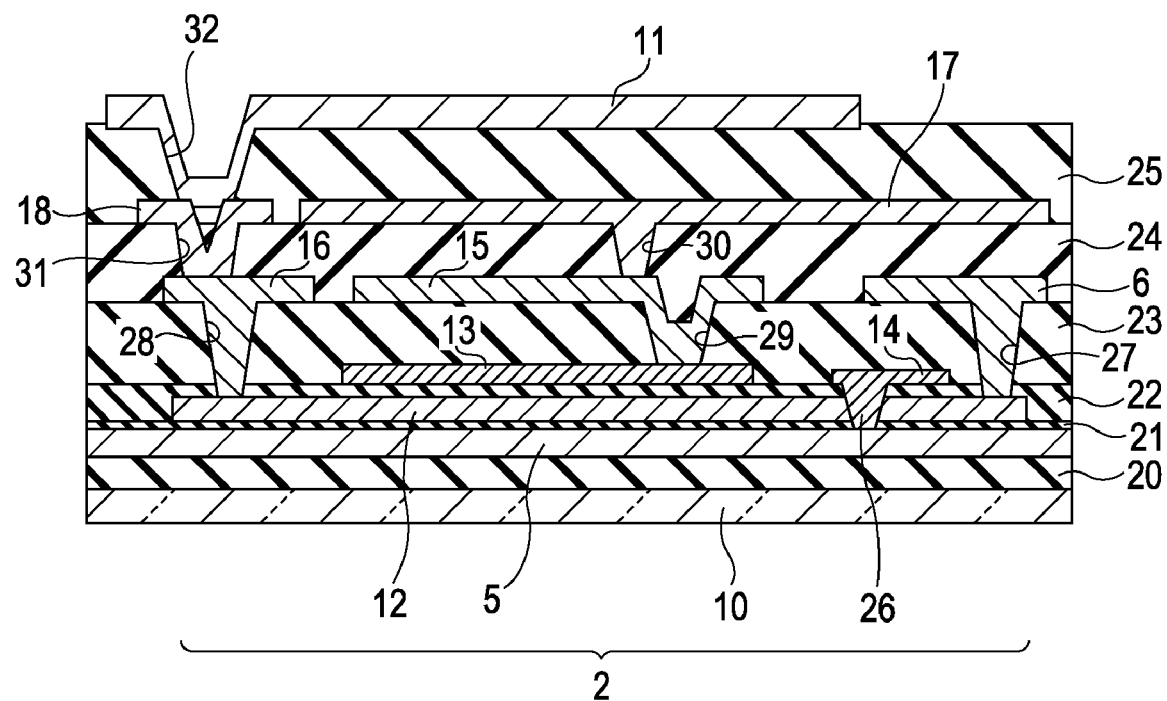
FIG. 3 is a cross-sectional view illustrating the layered structure of the array substrate according to the first embodiment.

FIG. 2 is a flat layout diagram of the principal components of the array substrate according to the present embodiment, and FIG. 3 is a cross-sectional diagram illustrating the layered stricture of this array substrate. Note that FIG. 3 illustrates all principal components included in the layered structure of the array substrate, and accordingly the planar layout of the components shown here is not the same as the actual layered structure thereof.

The array substrate 10 is formed of, for example, a glass substrate, quartz substrate, silicon substrate, or the like, and as shown in FIG. 2, formed on the substrate is a layered structure including the above-described scanning lines 5, data lines, pixel electrodes 11, and so forth. This layered structure is of a multi-layered structures having a first layer, second layer, third layer, fourth layer, fifth layer, and sixth layer, in order from the bottom, i.e., from the side closer to the array substrate 10. Of these, the first layer includes the scanning lines 5, the second layer includes a semiconductor layer making up the transistors 2, the third layer includes one electrode 13 of the storage capacity (hereafter also referred to as "storage capacitor electrode") and gate electrode 14 of the transistors 2, the fourth layer includes data lines 6 and relay electrode layers 15 and 16, the fifth layer includes a fixed electrode layer 17 and relay electrode layer 18, and the sixth layer includes a pixel electrode 11.

Accordingly, the storage capacitor electrodes 13 and gate electrodes 14 of the transistors 2 are formed at the same layer (third layer). In the same way, the data lines 6 and relay electrode layers 15 and 16 are formed in the same layer (fourth layer), and the fixed electrode layer 17 and relay electrode layer 18 are formed in the same layer (fifth layer). Note there, that the term "same layer" means a layer which is formed by the same manufacturing processing (film-formation process) at roughly the same time, regardless or whether there is electrical or mechanical connection therebetween. Thus, the number of layers of multi-layer wiring can be reduced and the manufacturing process can be simplified by forming the relay electrode layers 15, 16, and 18, at the function layers of the data layer 6, fixed electrode layer 17, and so forth, between the pixel electrode 11 and semiconductor layer 12.

A base insulating film 20 is formed on the surface of the arrayed substrate 10, with the first through sixth layers being formed in a multi-layered structure on the base insulating film 20. Of these first through sixth layers, a first insulating film 21 is formed between the first layer and second layer, a second insulating film 22 is formed between the second layer and third layer, a third insulating film 23 is formed between the third layer and fourth layer, a fourth insulating film 24 is formed between the fourth layer and fifth layer, and a fifth insulating film 25 is formed between the fifth layer and sixth layer.

Of these, the fifth insulating film 25 should be formed to a thickness of 0.5 times or greater the distance between pixel electrodes adjacent in the horizontal direction. For example, in the event that the distance between pixel electrodes adjacent in the horizontal direction is 1.0 μm, the fifth insulating film 25 is preferably 500 nm or greater, and even more preferably 750 nm or greater. Ensuring sufficient film thickness for the fifth insulating film 25 in this way reduces the parasitic capacitance occurring between the relay electrode layer connected to the pixel potential and the pixel electrode of the adjacent pixel, and also enables the electric field occurring between the pixel potential and common potential to be reduced. Consequently, optical property deterioration of the electro-optical substance can be suppressed, thereby maintaining good image quality.

The scanning lines 5 are formed of a metal such as, for example, titanium (Ti), chromium (Cr), aluminum (Al), tungsten (W) tantalum (Ta), molybdenum (Mo), and so forth, either in the form of a single elemental metal, an alloy or metal silicide or polysilicon including at least one of the above metals, or a layered structure thereof. Electrically connected to the scanning lines 5 are gate electrodes 14 of the transistors 2 for driving the pixels, via the contact holes 26. The contact holes 26 are formed penetrating the first insulating film 21 and second insulating film 22 at a position offset from the semiconductor layer 12.

The semiconductor layer 12 is formed of polysilicon or the like for example, and makes up the transistors 2 as well as gate electrodes 14. The source electrode of the transistors 2 (one end portion of the semiconductor layer 12) is electrically connected to the data lines 6 via contact holes 27. Also, the drain electrode of the transistors 2 (other end portion of the semiconductor layer 12) is electrically connected to the relay electrode layer 16 via contact holes 28. The contact holes 27 and 28 are formed penetrating the second insulating film 22 and third insulating film 23.

The storage capacitor electrodes 13 configure storage capacity between the electrodes 13 and the facing semiconductor layer 12, via the second insulating film 22. The storage capacitor electrodes 13 are electrically connected to the relay electrode layer 16 via contact holes 29. The contact holes 29 are formed penetrating the third insulating layer 23.

The relay electrode layer 15 is for relaying electrical connection between the fixed electrode layer 17 of the layer above the relay electrode layer 15 (i.e., the fifth layer), and the storage capacitor electrodes 13 of the layer below the relay electrode layer 15 (i.e., the third layer). Accordingly, the fixed electrode layer 17 is electrically connected to the relay electrode layer 15 via contact holes 30. The contact holes 30 are formed penetrating the fourth insulating film 24.

The relay electrode layer 16 is for relaying electrical connection between the relay electrode layer 18 of the layer above the relay electrode layer 16 (i.e., the fifth layer), and the pixel electrodes 11 of the sixth layer and the semiconductor layer 12 of the third layer. Accordingly, the relay electrode layer 16 is electrically connected to the relay electrode layer 18 via contact holes 31, and the relay electrode layer 18 is electrically connected to the pixel electrodes 11 via contact holes 32. The contact holes 31 are formed penetrating the fourth insulating film 24, and the contact holes 32 are formed penetrating the fifth insulating film 25.

The fixed electrode layer 17 is for supplying common potential Vcom, serving as a fixed potential, to the storage capacitor electrodes 13 formed on the array substrate 10, and in a state wherein the array substrate 10 and the facing substrate are assembled together, one or both ends in the vertical direction are electrically connected to the facing electrode on the facing substrate side. The fixed electrode layer 17 has a main line portion 17A formed in the vertical direction, and a dummy line portion 17B in the horizontal direction, with the dummy line portion 17B being formed in a state protruding in both horizontal directions from the main line portion 17A at positions sectioning the pixel electrodes adjacent in the vertical direction. Also, the fixed electrode layer 17 is formed as a multi-layer film of a low-resistance metal material such as aluminum, titanium, molybdenum, for example, including a light shielding layer formed of a light shielding material at at least one of the upper layer and lower layer of the low-resistance metal material. The light shielding layer is formed using a low-reflection metal such as tungsten for example, in the form of elemental metal, an alloy thereof, silicide, or the like. Accordingly, the fixed electrode layer 17 also functions as a light shielding layer for shielding unnecessary transmission of light at the light shielding region around the pixel electrodes 11.

Figure 4:
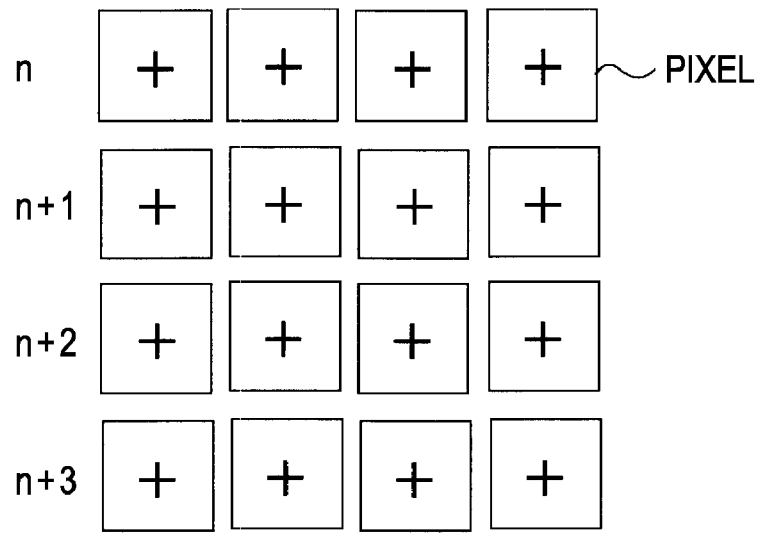
FIG. 4 is a diagram illustrating the potential polarity state of each pixel as to a common potential.

Such a configuration wherein the fixed electrode layer 17 also serves as the light shielding layer does away with the need for a process to form a light shielding layer separately, and accordingly, manufacturing costs can be reduced and yield can be improved, while realizing high image quality. Also, employing a driving method such as shown in FIG. 4 wherein the potential of vertically-adjacent pixels as to the common potential Vcom is of the same polarity (e.g., frame inversion driving) reduces potential difference between pixels as compared to a case wherein the polarity of pixel potential is opposite. Accordingly, the parasitic capacitance generated between, for example, the n'th pixel electrode 11 and the n+1'th row relay electrode layer 18 is reduced. Accordingly, high image quality can be realized.

The above-described transistors 2, storage capacitors 4, scanning lines 5, data lines, 6, and so forth, are positioned within the light-shielding region around the pixel electrodes 11 formed of the fixed electrode layer 17. For example, with a configuration wherein the fixed electrode layer 17 also serves as the light-shielding film as described above, the data lines 6 of the transistors 2 are formed in the region shielded by the main line portions 17A of the fixed electrode layer 17 primarily in the vertical direction, and the scanning lines 5 are formed in the region shielded by the dummy line portions 17B of the fixed electrode layer 17 primarily in the horizontal direction. Also, the storage capacitors 4 are formed in regions shielded by the fixed electrode layer 17 near intersections of the scanning lines 5 and data lines 6.

The pixel electrodes 11 are formed of a transparent electroconductive material such as ITO (Indium Tin Oxide) or the like. Multiple pixel electrodes 11 are provided in a matrix fashion corresponding to intersections between the scanning lines 5 and data lines 6 on the array substrate 10. Around the pixel electrodes 11 is surrounded by the fixed electrode layer 17 serving also as the light shielding layer. However, there is discontinuity of the dummy line portions 17B of the fixed electrode layer 17 between data lines 6 adjacent in the horizontal direction (first direction), this discontinuity being at approximately halfway therebetween. Here, the relay electrode layer 18 is formed in island fashion in the state of the fixed electrode layer 17 being separated at the discontinuity portion, that is to say, in the gaps between the dummy line portions 17B of the fixed electrode layer 17. Accordingly, the fixed electrode layer 17 forms wiring lines in the form of stripes substantially in the vertical direction, but the wiring lines are formed of a low-resistance material such as aluminum or the like as described above, thereby enabling impedance to be set to a level equivalent to that of forming the wiring lines in matrix fashion. Accordingly, the common potential Vcom can be supplied to the storage capacitor electrodes 13 at the lower layer in a stable manner.

Figure 5:
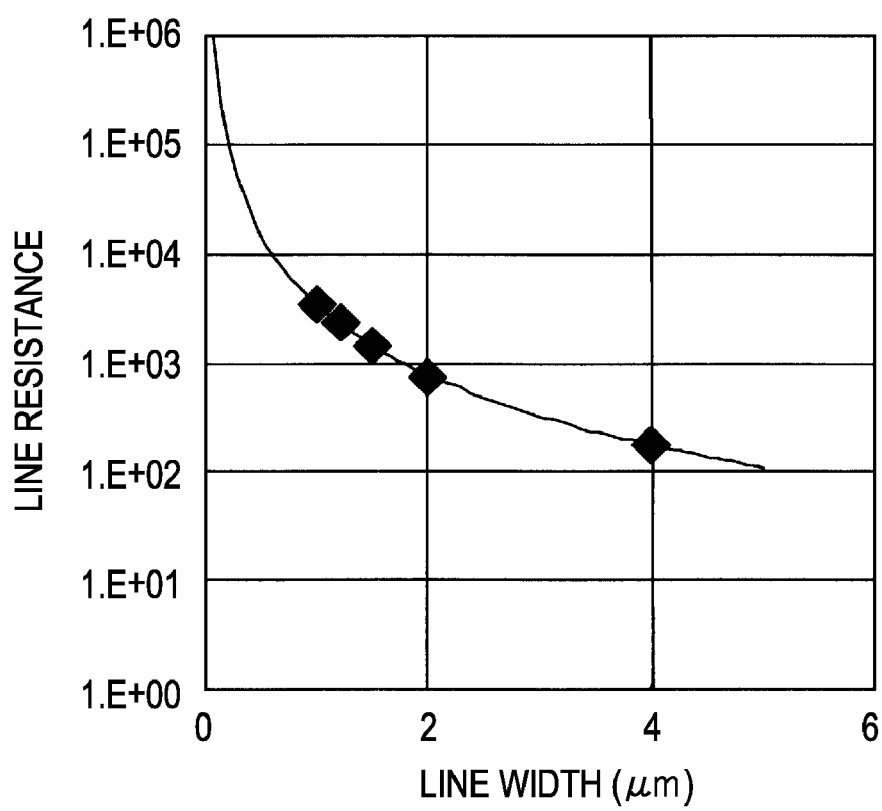
FIG. 5 is a diagram illustrating the relation between wiring line width and wiring line resistance.

FIG. 5 illustrates the results of experimentation regarding the relation between line width and line resistance of the fixed electrode layer 17. With this experiment, a fixed electrode layer 17 was formed of multi-layer wiring including aluminum. As can be understood from the drawing, reducing the line width of the fixed electrode layer 17 gradually increases the value of the line resistance up to a line width of 1.0 μm, but once the line width is narrower than 1.0 μm, the value of the line resistance markedly increases. Accordingly, it has been found to be desirable to form the line width of the fixed electrode layer 17 so as to be 1.0 μm or wider. Of course however, excessive widening of the line width of the fixed electrode layer 17 increases the light shielding region by just that much, reducing the aperture of the pixels. Accordingly, line width of the fixed electrode layer 17 should be set to be 2.0 μm or less. Thus stipulating the line width of the fixed electrode layer 17 to be between 1.0 μm and 2.0 μm enables suppressed potential difference in applied voltage due to difference in pixel position within the display image of the liquid crystal display panel upon applying the common potential Vcom from the fixed electrode layer 17 to the storage capacitor electrodes 13 via the relay electrode layer 15. Accordingly, the common potential Vcom can be uniformly applied to the storage capacitor electrodes 13 of the pixels over the entire display region, consequently yielding good image quality.

The relay electrode layer 18 is formed rectangular in the planar vertical direction, with the longitudinal dimension of each rectangular form approximately matching the dimensions of the line width of the dummy wiring portion 17B of the fixed electrode layer 17. This relay electrode layer 18 is formed at the time of patterning the fixed electrode layer 17 formed on the entire face of the array substrate 10 by photolithography or the like, during the manufacturing processes of the liquid crystal display panel, by removing the portion between the dummy wiring portions 17B of the fixed electrode layer 17 and the relay electrode layer 18 by etching or the like. Accordingly, the short end edge portions of the relay electrode layer 18 rectangular shapes, i.e., the ends encountered in the longitudinal direction, linearly agree with the wiring width edge portions of the dummy wiring portion 17B of the fixed electrode layer 17, i.e., the sides encountered traveling in the line width direction.

Also, the contact holes 31 formed in the fourth insulating film 24 below the relay electrode layer 18 and the contact holes 32 formed in the fifth insulating film 25 above the relay electrode layer 18 are formed adjacent one to another in the vertical direction (second direction) when viewed in planar fashion. More specifically, in an relay electrode layer 18 formation region, a contact hole 31 is formed at the upper side in the vertical direction, and a contact hole 32 is formed at the lower side in the vertical direction.

Figure 6A:
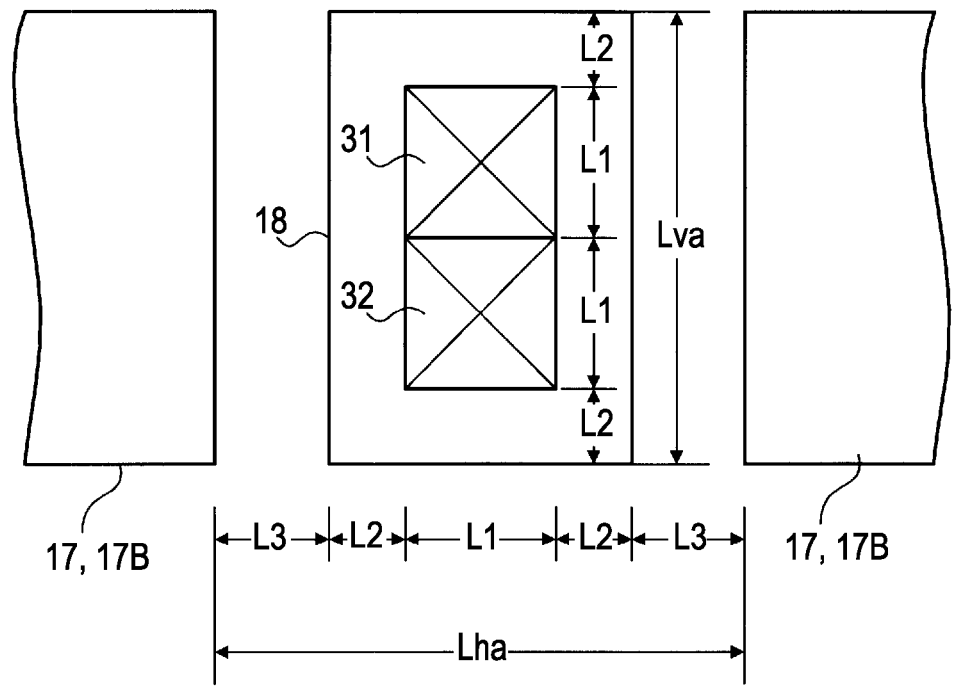
FIG. 6 is a diagram illustrating the dimensional relation between a case of employing a wiring layout the same as with the first embodiment and a case of employing a known wiring layout.
Figure 6B:
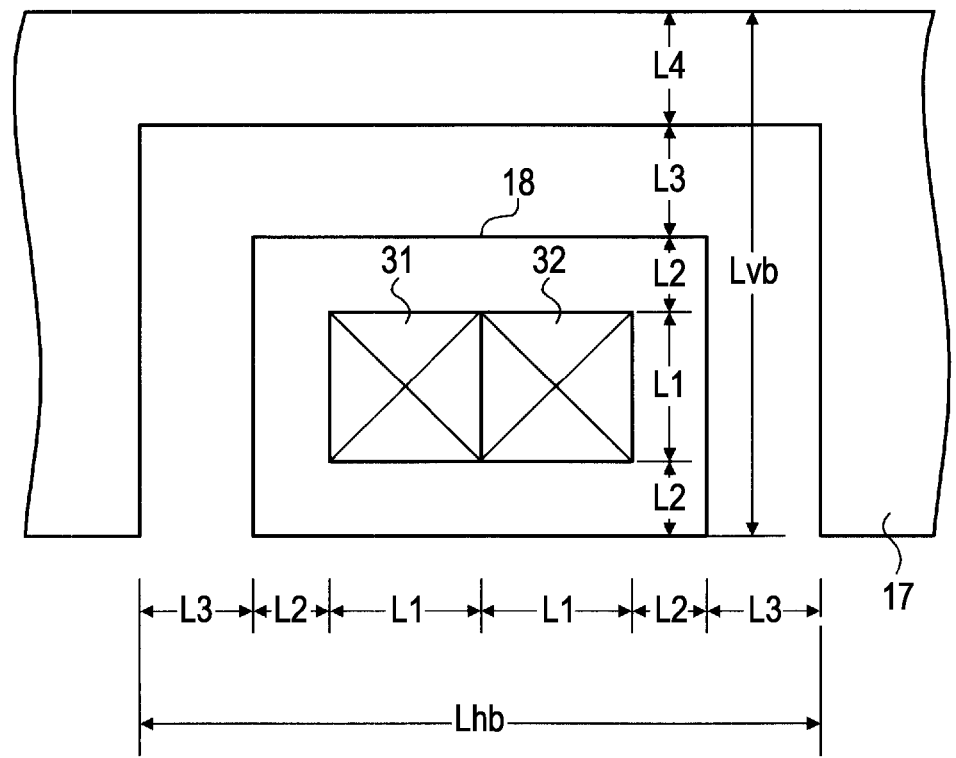

FIGS. 6A and 6B show a comparison of the layout of the wiring, with FIG. 6A illustrating the dimensional relation in a wiring layout following that of the present embodiment, while FIG. 6B illustrates the dimensional relation in a wiring layout following that of a known arrangement (e.g., Japanese Unexamined Patent Application Publication No. 2004-170909 mentioned earlier). Note that both FIGS. 6A and 6B illustrate the portion in FIG. 2 surrounded by single-dot broken line in an extracted manner and expanded, with the corresponding components being denoted with the same reference numerals for sake of description.

Also, in FIGS. 6A and 6B, the hole diameter of the contact holes 31 and 32 are the same in both the vertical and horizontal direction, which will be represented by L1, and the dimension from the contact holes 31 and 32 to the perimeter edge portion of the relay electrode layer 18 is L2. Also, the gap dimension between the relay electrode layer 18 and the fixed electrode layer 17 is L3 which is the same in both the vertical and horizontal directions, and the line width of the thin line portions of the fixed electrode layer 17 circumventing the relay electrode layer 18 in a box-shaped manner is L4.

Applying the above dimensional symbols (L1, L2, L3, L4) to the actual components and comparing the overall dimensional relation yields the following. First, in FIG. 6A, the horizontal dimension Lha necessary for planar layout around the island-shaped relay electrode layer 18 is obtained by $$Lha = L1 + 2 \times L2 + 2 \times L3,$$

and the dimension Lva in the vertical direction is obtained by $$Lva = 2 \times L1 + 2 \times L2.$$

In the same way, in FIG. 6B, the horizontal dimension Lhb necessary for planar layout around the island-shaped relay electrode layer 18 is obtained by $$Lhb=2\times L1+2\times L2+2\times L3,$$

and the dimension Lvb in the vertical direction is obtained by $$Lvb=L1+2\times L2+L3+L4.$$

Now, identifying the relative magnitude in the above dimensions L1, L2, L3, and L4, in light of the actual manufacturing processing and design conditions yields $$L1>L3>L2,$$

$$L3\approx L4,$$

and more specifically, $$L2=0.3\times L1,$$

$$L3=0.7\times L1,$$

$$L4=0.7\times L1.$$

Substituting this relative dimensional relation into the above expressions yield the following.

An arrangement employing a wiring layout following that of the present embodiment will have $$Lha=L1\times(1+0.6+1.4)=3.0\times L1$$

$$Lva=L1\times(2+0.6)=2.6\times L1$$

while an arrangement employing a wiring layout following that of the known art will have $$Lhb=L1\times(2+0.6+1.4)=4.0\times L1$$

$$Lvb=L1\times(1+0.6+0.7+0.7)=3.0\times L1.$$

This shows that an arrangement employing a wiring layout following that of the present embodiment, wherein the contact holes 31 and 32 are arrayed vertically and the relay electrode layer 18 is formed in a rectangular shape corresponding thereto, the size in the horizontal direction necessary for the planar layout around the relay electrode layer 18 can be reduced by 1.0×L1 (which is equivalent to one contact hole). Accordingly, the center distance between pixel electrodes 11 adjacent in the horizontal direction can be reduced, thereby realizing finer pixels and narrower pitch of pixels.

On the other hand, with regard to the size necessary in the vertical direction, there is no need to secure an area of layout of the wiring line of the fixed electrode layer 17 above or below the relay electrode layer 18 (corresponding to the dimensions L3+L4), so the size in the vertical direction can be reduced by 0.4×L1. Accordingly, in a case wherein the pixel pitch in the vertical direction is uniform, the line width of the dummy wiring portion 17B can be reduced and the aperture of the pixels in the vertical direction enlarged, thereby improving the aperture ratio and thus the brightness of the liquid crystal display panel. Also, in a case wherein the wiring width of the dummy wiring portion 17B is constant, the freedom of layout for the relay electrode layer 18 and the contact holes 31 and 32 can be improved. Also, in a case wherein the aperture diameter of the pixels in the vertical direction is constant, the pitch of the pixels in the vertical direction can be reduced by narrowing the wiring width of the dummy wiring portion 17B.

Figure 7:
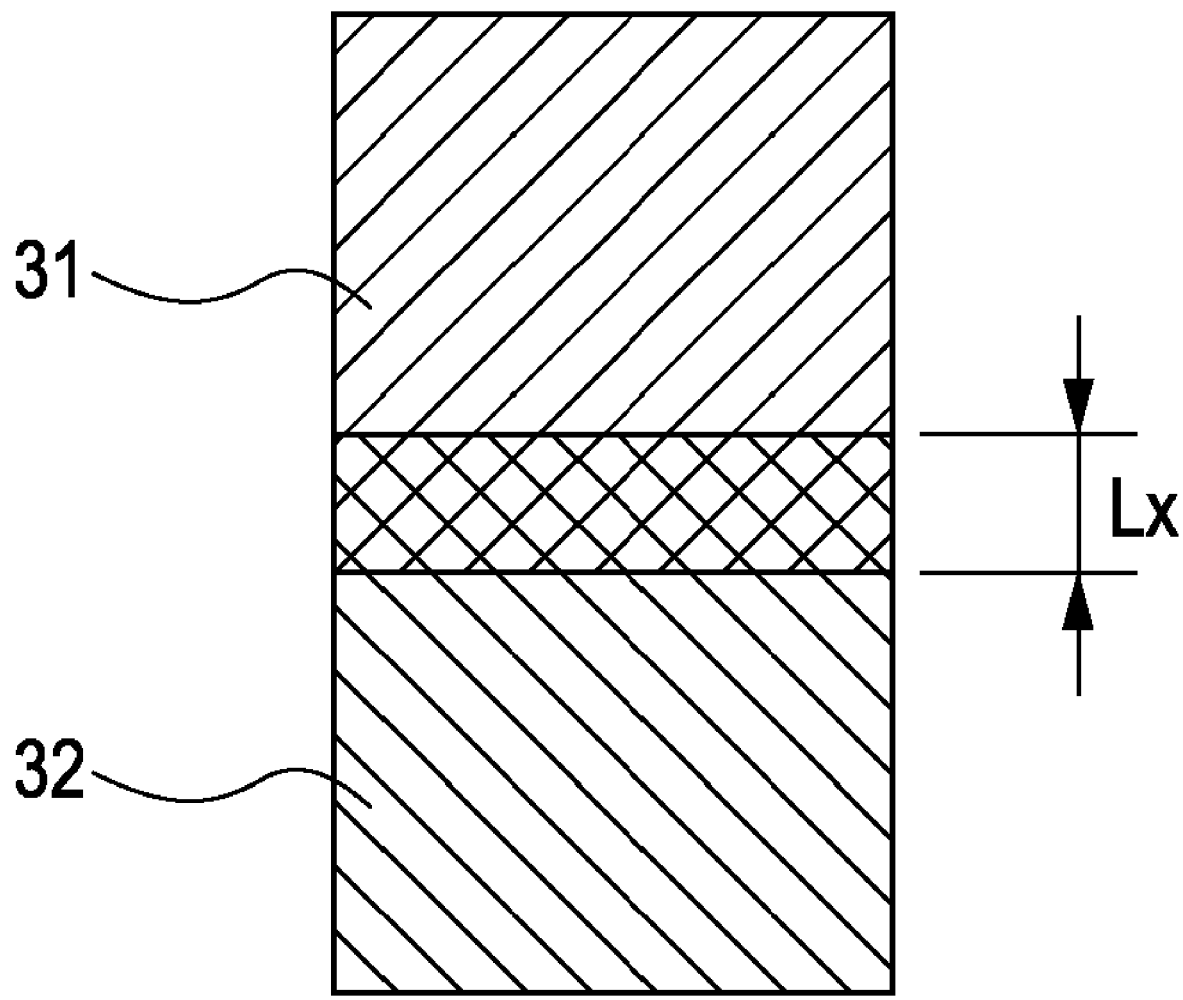
FIG. 7 is a planar layout view of a state in which two contact holes are placed one upon another.

Further, as shown in FIG. 7, a layout wherein the planar layout of the contact holes 31 and 32 within the formation region of the relay electrode layer 18 is such that the contact holes 31 and 32 partially overlap in the vertical direction enables the formation region of the relay electrode layer 18 in the vertical direction to be reduced by a dimension corresponding to the overlapping dimension Lx. Thus, the aperture ratio and consequently the brightness of the liquid crystal display panel can be improved even more.

It should be noted that in light of manufacturing process, the overlapping dimension Lx can be up to around ¼ the hole diameter of the contact holes 31 and 32. Arrangements wherein the contact holes 31 formed in the fourth insulating film 24 below the relay electrode layer 18 with tungsten (W) or polysilicon or the like for example, will allow the above overlapping dimension Lx to be even greater, maximally a completely-overlapping state.

Second Embodiment

Figure 8:
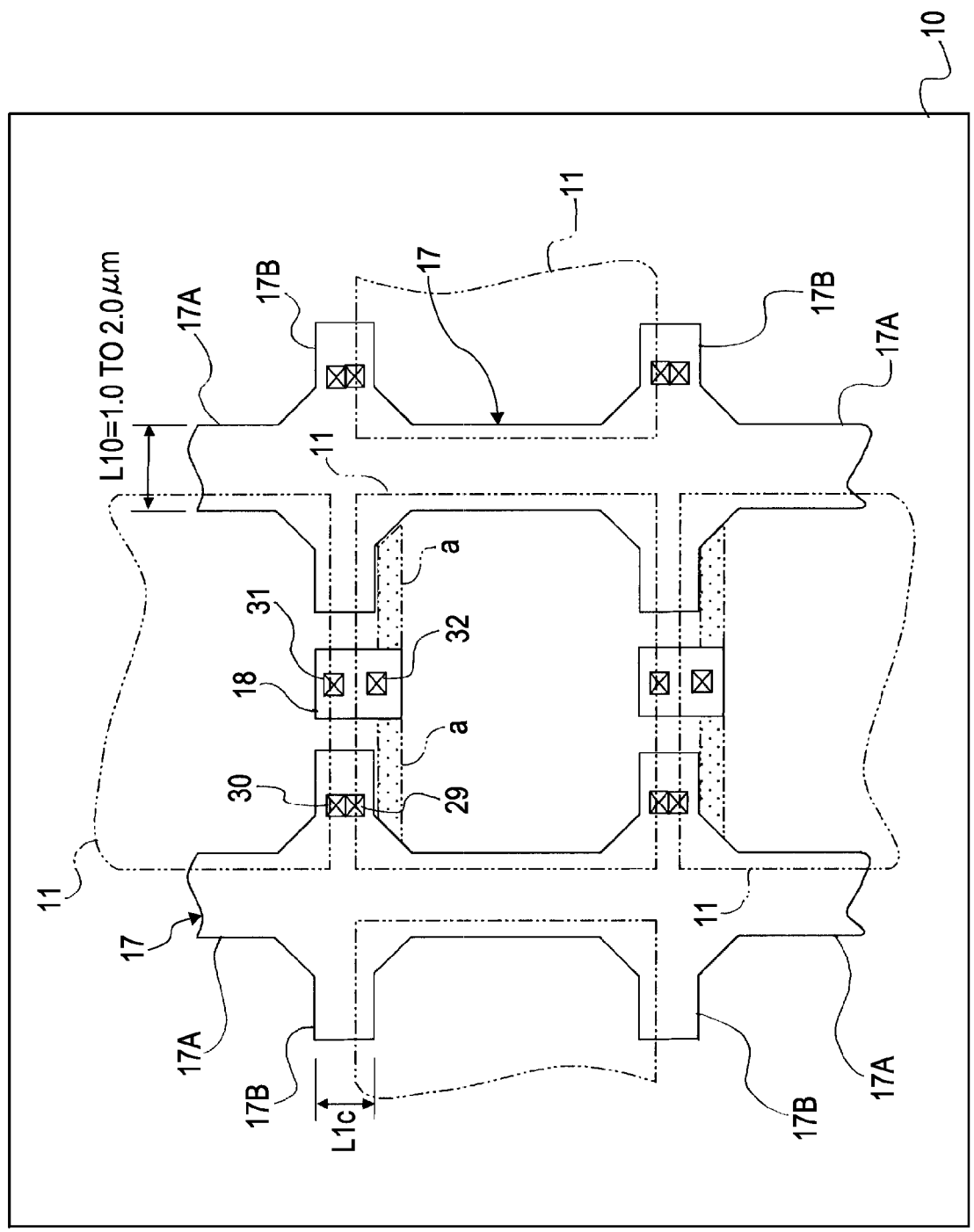
FIG. 8 is a planar layout view of principal components of an array substrate according to a second embodiment.

FIG. 8 is a planar layer view of principal components of an array substrate according to a second embodiment.

Transistors 2, storage capacitors 4, scanning lines 5, data lines, 6, and so forth, are positioned within the light-shielding region around the pixel electrodes 11 formed of the fixed electrode layer 17. For example, with a configuration wherein the fixed electrode layer 17 also serves as the light-shielding film as described above, the data lines 6 of the transistors 2 are formed in the region shielded by the main line portions 17A of the fixed electrode layer 17 primarily in the vertical direction, and the scanning lines 5 are formed in the region shielded by the dummy line portions 17B of the fixed electrode layer 17 primarily in the horizontal direction. Also, the storage capacitors 4 are formed in regions shielded by the fixed electrode layer 17 near intersections of the scanning lines 5 and data lines 6.

However, there is discontinuity of the dummy line portions 17B of the fixed electrode layer 17 between data lines 6 adjacent in the horizontal direction (first direction), this discontinuity being at approximately halfway therebetween. Here, the relay electrode layer 18 is formed in island fashion in the state of the fixed electrode layer 17 being separated at the discontinuity portion, that is to say, in the gaps between the dummy line portions 17B of the fixed electrode layer 17. Accordingly, the fixed electrode layer 17 forms wiring lines in the form of stripes substantially in the vertical direction, but the wiring lines are formed of a low-resistance material such as aluminum or the like as described above, thereby enabling impedance to be set to a level equivalent to that of forming the wiring lines in matrix fashion. Accordingly, the common potential Vcom can be supplied to the storage capacitor electrodes 13 at the lower layer in a stable manner.

The relay electrode layer 18 is formed rectangular in the planar vertical direction (second direction), with a feature of this second embodiment being that the line width L1$d$ in the vertical direction being greater than the line width L1$c$ of the dummy wiring portion 17B of the fixed electrode layer 17 in the vertical direction. This relay electrode layer 18 is formed at the time of patterning the fixed electrode layer 17 formed on the entire face of the array substrate 10 by photolithography or the like, during the manufacturing processes of the liquid crystal display panel, by removing the portion between the dummy wiring portions 17B of the fixed electrode layer 17 and the relay electrode layer 18 by etching or the like. Also, the relay electrode layer 18 also functions as a light shielding layer for shielding unnecessary transmission of light at the light shielding region around the pixel electrodes 11, along with the fixed electrode layer 17.

Also, the contact holes 31 formed in the fourth insulating layer 24 below the relay electrode layer 18 and the contact holes 32 formed in the fifth insulating film 25 above the relay electrode layer 18 are formed adjacent one to another in the vertical direction (second direction) when viewed in planar fashion. More specifically, in an relay electrode layer 18 formation region, a contact hole 31 is formed at the outer side of the pixel, and a contact hole 32 is formed at the inner side of the pixel.

The pixel electrodes 11 are formed of a transparent electroconductive material such as ITO (Indium Tin Oxide) or the like. Multiple pixel electrodes 11 are provided in a matrix fashion corresponding to intersections between the scanning lines 5 and data lines 6 on the array substrate 10. Around the pixel electrodes 11 is surrounded by the fixed electrode layer 17 serving also as the light shielding layer.

Figure 9:
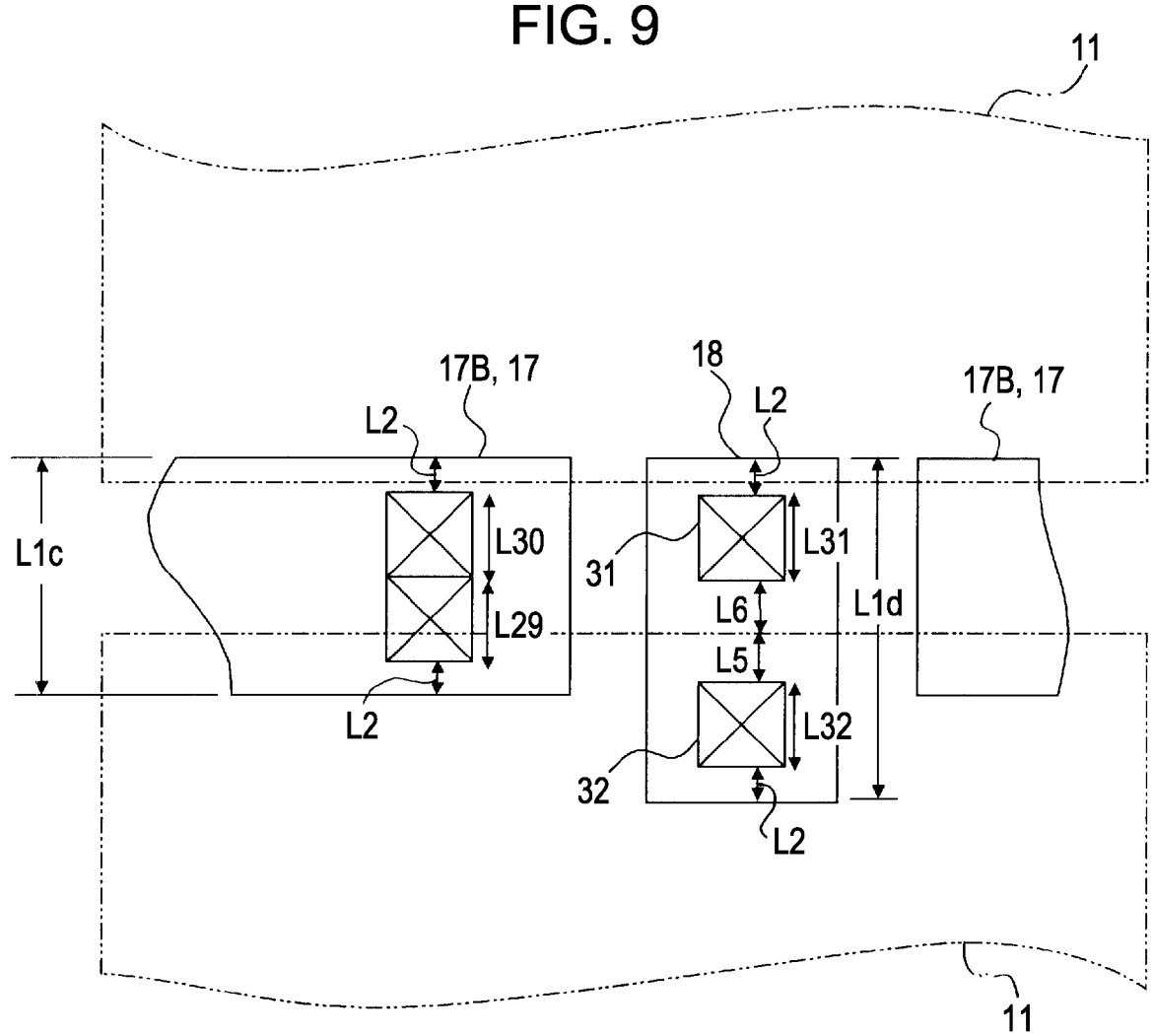
FIG. 9 is a planar layout view wherein the principal components shown in FIG. 8 are enlarged.

FIG. 9 is a planar layout view wherein the principal components shown in FIG. 8 are enlarged. The following is a detailed description of the configuration around the fixed electrode layer 17 and relay electrode layer 18 which is a feature of the second embodiment, with reference to FIG. 9.

As described above, a feature of the second embodiment is that the line width L1$c$ of the dummy wiring portion 17B in the vertical direction (second direction) smaller than the line width L1$d$ of the relay electrode layer 18 in the vertical direction. It is particularly important that the line width L1$c$ of the dummy wiring portion 17B is narrowed at the pixel side where the pixel electrode 11 is connected at the relay electrode layer 18 via the contact hole 32, in a state of the reduction region "a" indicated by the two-dot broken line in FIG. 7 having been removed.

Now, it is important for the relay electrode layer 18 to have been formed overlapping the pixel electrode 11 sufficiently, e.g., around 2.0 μm, so as to ensure sufficient connection with the pixel electrode 11. Also, the relay electrode layer 18 also functions as a light shielding layer in the light shielding region around the pixel electrode 11 along with the fixed electrode layer 17, so there is the need for overlapping with the edge of the pixel electrode 11 of the pixel adjacent in the vertical direction (second direction) by around 0.5 μm. Accordingly, the line width L1$d$ of the relay electrode layer 18 in the vertical direction (second direction) is set so as to satisfy the following. The contact holes 31 and 32 are connected above and below the relay electrode layer 18, and the line width L1$d$ necessary for the relay electrode layer 18 is $$L1d = L31 + L32 + 2 \times L2 + L5 + L6$$

wherein L2 is a dimension set taking into consideration the opening widths L31 and L32 of the contact holes 31 and 32 and the leeway in the process regarding the placement position of the contact holes 31 and 32 as to the relay electrode layer 18. L5 is a space set taking into consideration change in manufacturing dimensions between the end of the contact hole 32 and the end of the pixel electrode 11, and L6 is a space set between the pixel electrode 11 and the adjacent pixel electrode 11 to ensure space for working.

On the other hand, the dummy wiring portions 17B of the fixed electrode layer 17 also function as a light shielding layer at the light shielding region around the pixel electrodes 11, so the line width L1$c$ of the dummy wiring portions 17B is sufficient as long as the edges on either side of the dummy wiring portions 17B can be disposed overlapping the edges of the pixel electrodes 11 disposed adjacently in the vertical direction, and such that the pixel electrodes 11 can be electrically separated at the dummy wiring portions 17B. The line width L1$c$ in the vertical direction of the dummy wiring portions 17B of the fixed electrode layer 17 for supplying fixed potential is $$L1c = 2 \times L1 + 2 \times L2$$

wherein L2 is a dimension set taking into consideration the opening widths L29 and L30 of the contact holes 29 and 30 and the leeway in the process regarding the placement position of the contact holes 29 and 30 as to the relay electrode layer 18.

Accordingly, the line width L1$c$ of the dummy wiring portions 17B is laid out with a width smaller than the line width L1$d$ of the relay electrode layer 18 by an amount corresponding to the dimensions L5+L6. That is to say, the relay electrode layer 18 needs to sufficiently overlap the pixel electrodes 11 so as to obtain sufficient contact with the pixel electrodes 11, whereas this does not need to be taken into consideration regarding the dummy wiring portions 17B, so the amount of overlap with the pixel electrodes 11 can be reduced, accordingly reducing the line width L1$c$ by that much. Such reduction of the line width L1$c$ in the vertical direction of the dummy wiring portions 17B enables the region "a" illustrated in FIG. 8 to be formed as an opening region, thereby realizing increased aperture ratio of the pixels.

Figure 10:
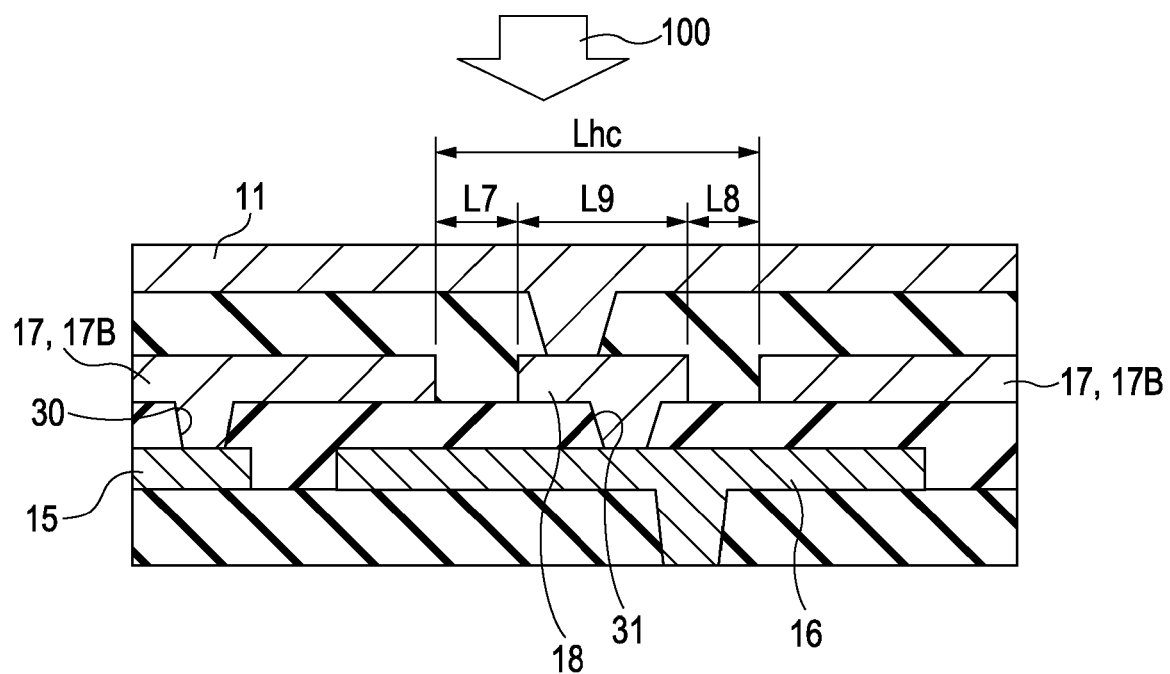
FIG. 10 is a cross-sectional view of the arrangement shown in FIG. 9 from the horizontal direction.

Also, FIG. 10 is a cross-sectional view taken in the horizontal direction in FIG. 9. With the electro-optical device shown in the second embodiment, the relay electrode layer 18 and the dummy wiring portions 17B of the fixed electrode layer 17 formed at the same layer as the relay electrode layer 18 are electrically separate, with the planar spacings L7 and L8 thereof being formed to 1.0 μm or less, and the relay electrode layer 16 being disposed at the lower layer at the separated region. Particularly, the relay electrode layer 16 situated at the lower layer has planar overlapping with the spacings L7 and L8.

Accordingly, in the event that external incident light 100 is cast in from the pixel electrode 11 side and leaks downward from the spacings L7 and L8 between the fixed electrode layer 17 serving as a light shielding layer and the relay electrode layer 18, the incident light 100 is cast onto the relay electrode layer 16 disposed overlapping the spacings L7 and L8 so as to be shielded. Consequently, situations can be prevented wherein the indecent light 100 leaks downward from the relay electrode layer 18 and scatters or leaks further downward beyond the relay electrode layers 15 and 16, which would allow light to enter the TFTs and deteriorate device properties, or leak to the reverse side of the substrate and cause deterioration in contrast and the like.

Note that the dimension Lhc necessary for layout of the relay electrode layer 18 in the horizontal direction (first direction) is the line width L9 of the relay electrode layer 18 in the horizontal direction, plus the spacings L7 and L8 necessary for separation from the fixed electrode layer 17, i.e., $$Lhc = L7 + L8 + L9.$$

Now, L9 is dependent on the diameter of the contact hole 31, so in order to narrow the necessary layout in the horizontal direction and to make the pixel pitch finer, the spacings L7 and L8 must be reduced.

Figure 11:
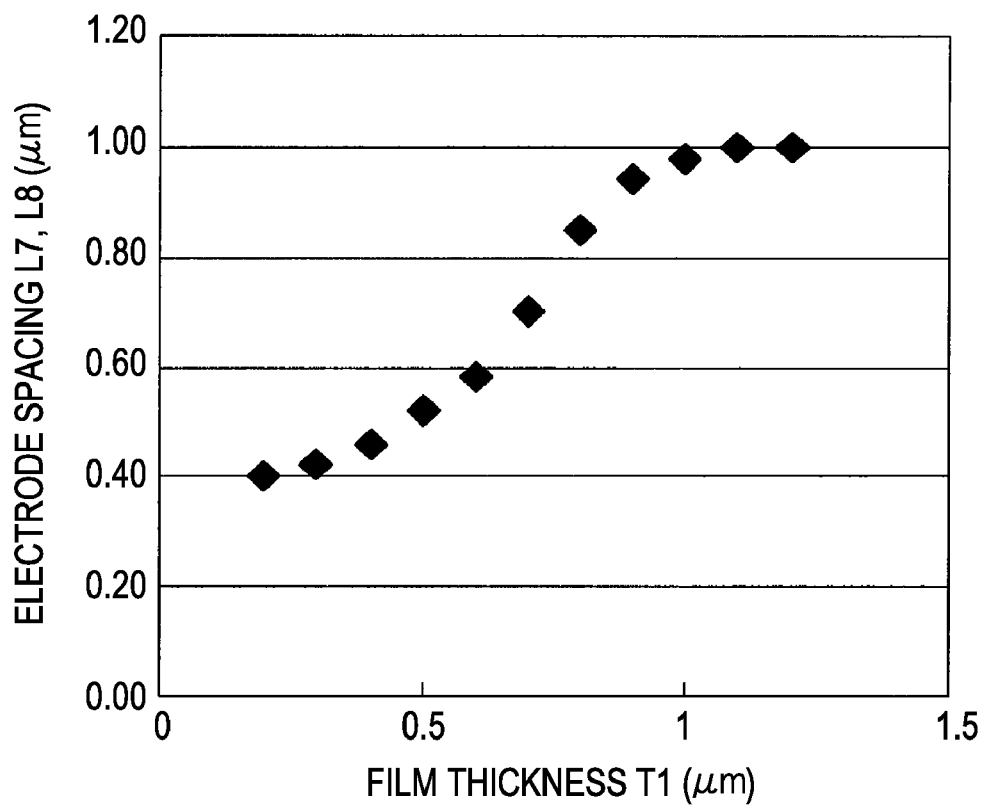
FIG. 11 is a graph illustrating the relation between electrode spacings L7 and L8 which can be formed with regard to a film thickness T1 of a fixed electrode layer and relay electrode layer formed of aluminum.

FIG. 11 illustrates the results of experimentation regarding the relation between the film thickness T1 of a fixed electrode layer and relay electrode layer formed of aluminum and the electrode spacings L7 and L8 which can be formed with regard to T1. Note that "the electrode spacings L7 and L8 which can be formed" means the overall workability by lithography and etching, and that the electrode spacings L7 and L8 which can be formed as to T1 will differ for cases of a fixed electrode layer and relay electrode layer formed of multi-layer film including aluminum.

In the event that the film thickness has been set thick, in order to lower resistance with a high-resistance material, or to increase light-shielding properties, the electrode spacings L7 and L8 need to be set to a considerable value. Experimentation has shown that if the film can be formed to a thickness T1 of 1.0 μm or less, the electrode spacings L7 and L8 can be set to 1.0 μm or less. Accordingly, the electrode spacings L7 and L8 can be set to 1.0 μm or less by stipulating the film thickness T1 of the fixed electrode layer and the relay electrode layer to be 1.0 μm or less, thereby enabling the pixel pitch in the horizontal direction to be narrower.

Figure 12:
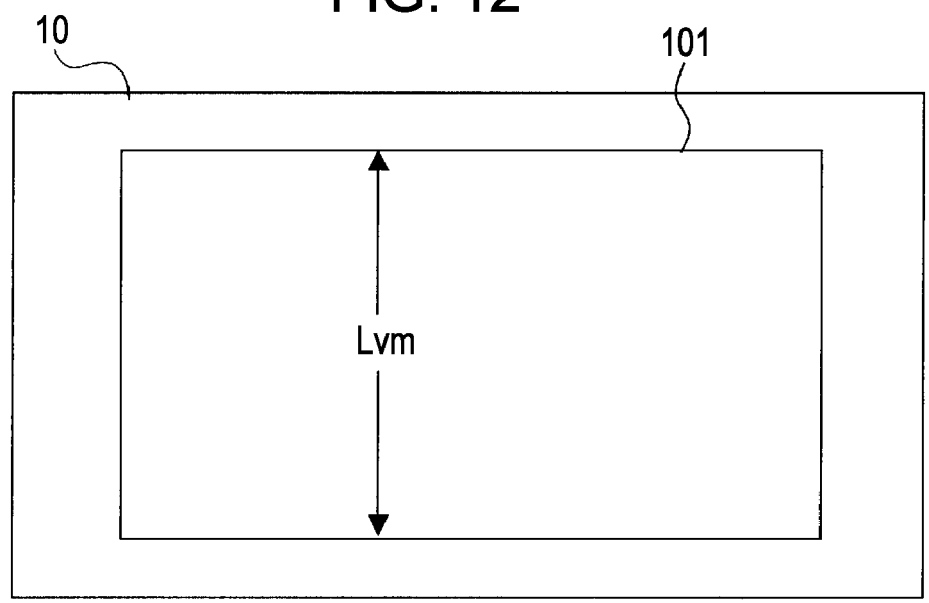
FIG. 12 is a planar layout view illustrating the overall configuration of an array substrate.

FIG. 12 is a planar layer view illustrating the overall configuration of an array substrate 10. As shown in the drawings, an image display region 101 wherein the pixels of the above-described configuration are disposed in matrix fashion in the middle of the array substrate 10. The length of the main line portion 17A at the fixed electrode layer generally agrees with the length Lvm of the image display region 101 in the vertical direction. This length Lvm differs according to the size of the electro-optical device, but in any case wiring resistance which is fairly low is required for the main line portion 17A.

Figure 13:
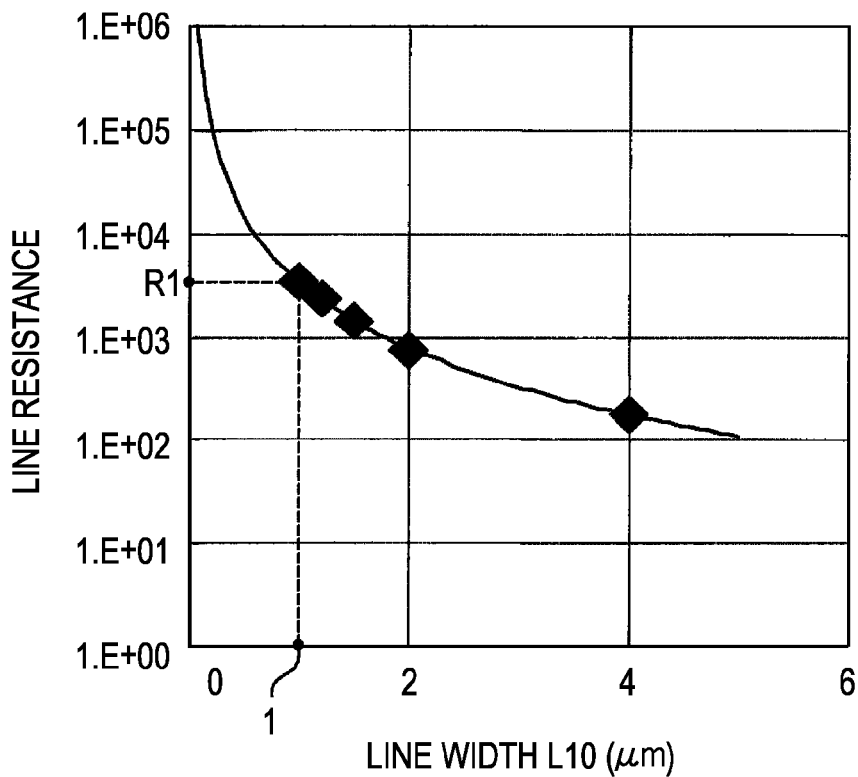
FIG. 13 is a graph of wiring line resistance as to a line width L10 of a main wiring portion in the fixed electrode layer.

FIG. 13 is a graph of wiring line resistance as to a line width L10 of the main wiring portion 17A in the fixed electrode layer 17, formed of a layered film including aluminum having a thickness of 100 nm. As shown in the graph, in the range wherein the line width L10 is 1.0 μm or greater, the wiring resistance is approximately proportional to the line width L10. With an electro-optical device wherein the length Lvm of the fixed electrode layer in the image display region does not need to be long, wiring resistance R1 when the line width L10 is 1.0 μm is $1.E+0.<R1<1.E+04.$ Accordingly, the line width L10 of the main wiring portion 17A can be reduced to as low as 1.0 μm. On the other hand, the upper limit of the width L10 of the main wiring portion 17A is preferably 2.0 μm or less, from the perspective of pixel aperture ratio. Accordingly, the line width L10 of the main wiring portion 17A of the fixed electrode layer 17 should be 1.0 μm to 2.0 μm.

Further reduction in the length Lvm enables reduction in the line width of the fixed electrode layer 17. For example, with a length Lvm of 10 mm, a line width of around 1.4 μm of the fixed electrode layer is sufficient to maintain resistance value around the same as that in a case wherein the length Lvm is 15 mm and the line width of the main wiring portion 17A is 2.0 μm (approximately equal to 1.E+03).

Figure 14:
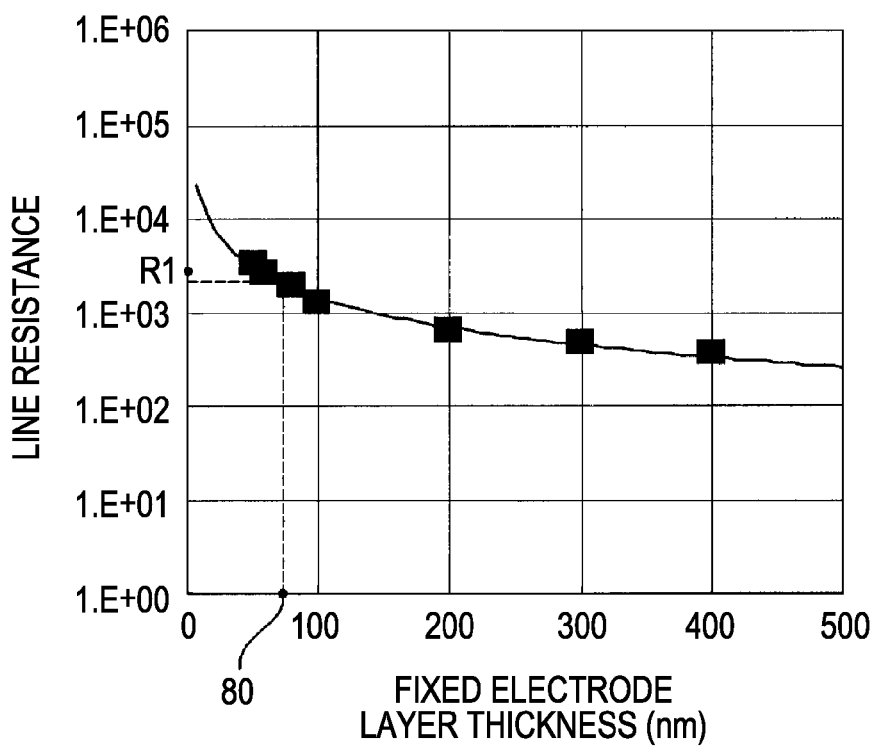
FIG. 14 is a graph of wiring resistance as to the film thickness T1 of the fixed electrode layer.

Also, FIG. 14 is a graph of wiring resistance as to the film thickness T1 of the fixed electrode layer 17. Note that the fixed electrode layer 17 is formed of aluminum with a width of 1.0 μm. As shown in the graph, wiring resistance (R1) necessary for driving an electro-optical device having a length Lvm of 15 mm in the vertical direction (second direction) for the fixed electrode layer in the image display region can be sufficiently obtained if the fixed electrode layer (electroconductive layer including low-resistance metal wiring) has a thickness of 80 nm or greater, so high quality images can be obtained by ensuring that the thickness of the fixed electrode layer is 80 nm or greater.

Third Embodiment

Figure 15:
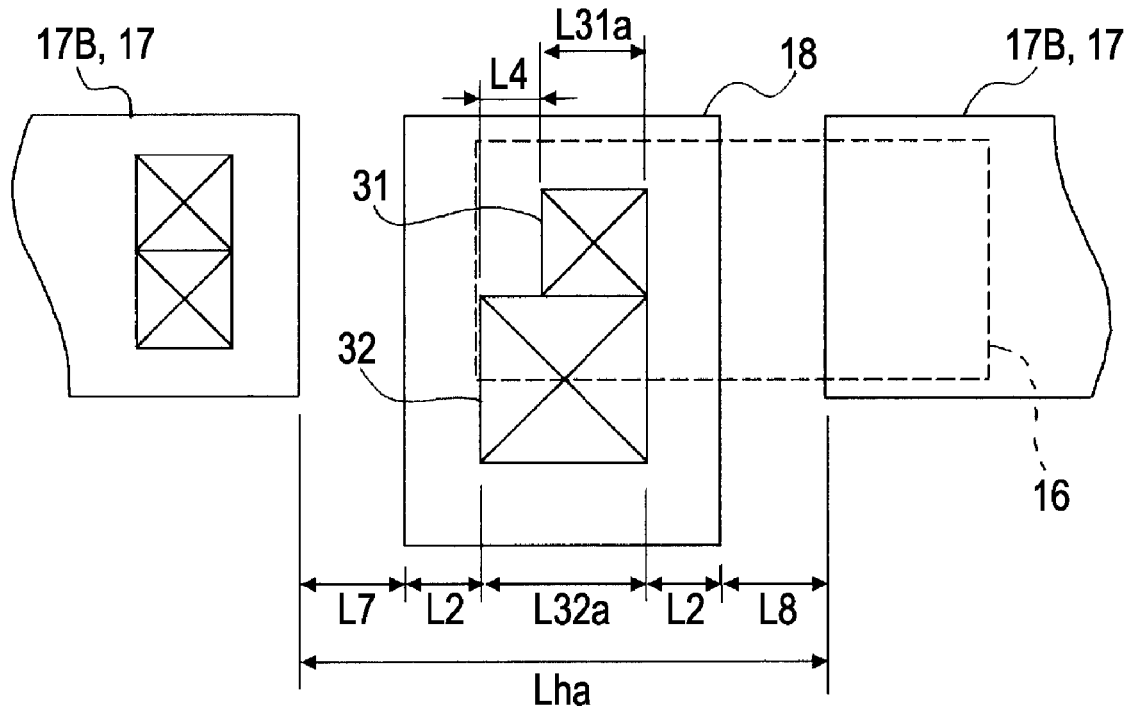
FIG. 15 is a planar layout view of principal portions for describing feature portions of a third embodiment.

FIG. 15 is a planar layout view of principal portions for describing feature portions of a third embodiment. This third embodiment differs from the above-described second embodiment with regard to the layout of the relay electrode layer 18 and the contact holes 31 and 32, and other configurations are the same.

That is to say, with the present embodiment, the contact holes 31 and 32 formed in the layers above and below the relay electrode layer 18 are arrayed in the vertical direction (second direction) when viewed in planar fashion. The contact holes 31 and 32 are formed with different opening diameters. The contact hole 31 which has a smaller diameter L31a is formed is formed within a formation width range of an opening diameter L32a in the horizontal direction (first direction) of the contact hole 32 which has the greater diameter. Accordingly, the contact holes 31 and 32 need to be formed with opening diameters of a difference that is greater than the margin for offsetting in the horizontal direction in the manufacturing process. Note that in the present embodiment, the contact hole 32 formed in the layer above the relay electrode layer 18 is illustrated as being larger than the contact hole 31 formed in the lower layer, but this may be reversed.

Such a layout wherein a contact hole 31 having a smaller diameter is positioned on the inner side of the opening diameter L32a of larger contact hole 32 results in the necessary dimension Lha in the horizontal direction necessary for planar layout around the island-shaped relay electrode layer 18 being $Lha=L32a+2\times L2+L7+L8$ wherein L2 is a dimension set taking into consideration the leeway in the process regarding the placement position of the contact hole 32 as to the relay electrode layer 18, and L7 and L8 are spacing between the relay electrode layer 18 and the fixed electrode layer 17, so there is no need to take into consideration the margin for offsetting between the contact hole 31 and the contact hole 32.

Moreover, increasing the difference in opening width in the horizontal direction between the contact hole 31 and contact hole 32 enables the control hole 31 to be freely laid out as long as within the range of diameter L32a of the contact hole 32. For example, even in a case wherein a layout is made such that the relay electrode layer 16 (see FIG. 7) which is connected to the relay electrode layer 18 by the contact hole 31 overlaps with the contact hole 32 at one edge, or even in a case wherein the contact hole 31 is laid out so as to be distanced from the edge of the relay electrode layer 16 by the dimension L4 and the process dimensions of the contact hole 31 and relay electrode layer change during the manufacturing process, an overlapping formation can be made with sufficient leeway, without having to increase the space in the horizontal direction. Accordingly, the pixel pitch in the horizontal direction can be narrowed.

Fourth Embodiment

Figure 16:
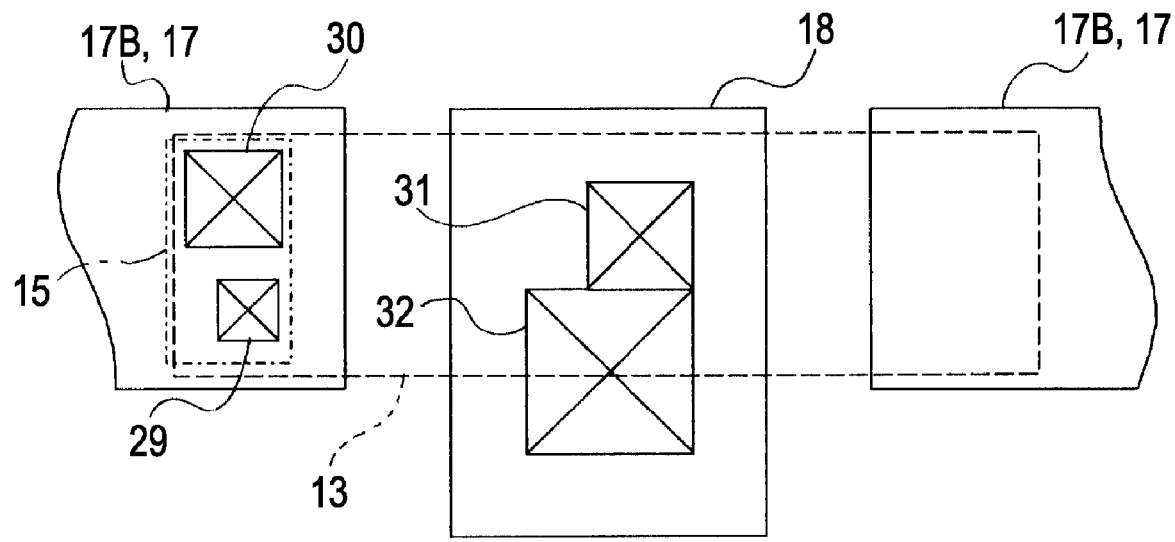
FIG. 16 is a planar layout view of principal portions for describing feature portions of a fourth embodiment.

FIG. 16 is a planar layout view of principal portions for describing feature portions of a fourth embodiment. This fourth embodiment differs from the above-described third embodiment with regard to the layout of the contact holes 29 and 30 connected to the fixed electrode layer 17, and other configurations are the same.

That is to say, with the present embodiment, the contact holes 29 and 30 formed in the layers above and below the relay electrode layer 15 are arrayed in the vertical direction (second direction) when viewed in planer fashion. The contact holes 29 and 30 are formed with different opening diameters. In the drawing, the contact hole 29 positioned at the layer above the relay electrode layer 15 is illustrated as being larger than the contact hole 29 situated in the lower layer. The contact hole 29, which has the smaller opening diameter, is formed within the formation width range of the opening diameter in the horizontal direction (first direction)of the contact hole 30 which has the greater diameter, in the same way as with the third embodiment. Note that in the present embodiment, the contact hole 30 formed in the layer above the relay electrode layer 15 is illustrated as being larger than the contact hole 29 formed in the lower layer, but this may be reversed.

Such a configuration does away with the need to take into consideration the margin of offset in the layout of the contact holes 29 and 30 in the horizontal direction, as with the case described with the contact holes 31 and 32. Further, freedom of layout is improved. For example, even in a case wherein a layout is made such that the capacitor electrode 13 which is connected to the relay electrode layer 15 by the contact hole 29 overlaps with the contact hole 30 at one edge, the contact hole 29 can be formed with sufficient leeway from the edge of the capacitor electrode 13. Accordingly, the pixel pitch in the horizontal direction can be narrowed.

The drawing shows a case wherein the opening diameters of the contact holes 31 and 32 differ, as described in the third embodiment. However, the third embodiment may be an arrangement wherein the opening diameters of the contact holes 31 and 32 are the same, with only the opening diameters of the contact holes 29 and 30 differing. It should be noted however, that changing the opening diameters of the contact holes 31 and 32 as with the third embodiment furthers the advantage of narrowing the pixel pitch in the horizontal direction.

Also, the third and fourth embodiments have described a case wherein the line width of the dummy wiring portion 17B in the fixed electrode layer 17 is smaller than the line width of the relay electrode layer 18 in the vertical direction. However, an arrangement wherein the line width of the dummy wiring portion 17B in the fixed electrode layer 17 and the line width of the relay electrode layer 18 in the vertical direction are the same may be applied to the third and fourth embodiments, and the pixel pitch can be narrowed in the horizontal direction in this case as well.

It should be understood by those skilled in the art that various modifications, combinations, sub-combinations and alterations may occur depending on design requirements and other factors insofar as they are within the scope of the appended claims or the equivalents thereof.

What is claimed is:

1. An electro-optical device comprising:
   an electro-optical substance layer;
   a pair of substrates facing one another across said electro-optical substance layer so as to sandwich said electro-optical substance layer therebetween; and
   a layered structure formed on one of said substrates, said layered structure including
      scanning lines formed in a first direction,
      data lines formed in a second direction which intersects said first direction,
      pixel electrodes formed corresponding to intersection portions of said scanning lines and said data lines,
      transistors for controlling switching of said pixel electrodes,
      storage capacitors electrically connected to said pixel electrodes, and
      a fixed electrode layer for supplying a fixed potential to one electrode of said storage capacitors,
   said scanning lines, said data lines, said transistors, and said storage capacitors, being arrayed within a light shielding region around said pixel electrodes;
   wherein said pixel electrodes, and a semiconductor layer where said transistors are formed, are electrically connected via a first relay electrode layer at the same layer as said fixed electrode layer and a second relay electrode layer at the same layer as said data lines;
   and wherein said fixed electrode layer is discontinuous between adjacent data lines in said first direction, with said first relay electrode layer being formed at this discontinuous portion in a separated state from said fixed electrode layer, and with a plurality of contact holes formed in a formation region of said first relay electrode layer in a state of electrically connecting to said first relay electrode layer, said contact holes being arrayed so as to be adjacent one to another in said second direction.

2. The electro-optical device according to claim 1, wherein each line width of said fixed electrode layer in said first direction and said second direction is set within a range of 1.0 μm to 2.0 μm.

3. The electro-optical device according to claim 1, wherein said plurality of contact holes are laid out overlapping at least partially in said second direction.

4. An electro-optical device comprising:
   an electro-optical substance layer;
   a pair of substrates facing one another across said electro-optical substance layer so as to sandwich said electro-optical substance layer therebetween; and
   a layered structure formed on one of said substrates, said layered structure including
      scanning lines formed in a first direction,
      data lines formed in a second direction which intersects said first direction,
      pixel electrodes formed corresponding to intersection portions of said scanning lines and said data lines,
      transistors for controlling switching of said pixel electrodes,
      storage capacitors electrically connected to said pixel electrodes, and
      a fixed electrode layer for supplying a fixed potential to one electrode of said storage capacitors,
   said scanning lines, said data lines, said transistors, and said storage capacitors, being arrayed within a light shielding region around said pixel electrodes;
   wherein said pixel electrodes, and a semiconductor layer where said transistors are formed, are electrically connected via an relay electrode layer at the same layer as said fixed electrode layer;
   and wherein said fixed electrode layer is discontinuous between adjacent data lines in said first direction, with said relay electrode layer being formed in the form of an island in the pattern gap at this discontinuous portion.

5. The electro-optical device according to claim 4, wherein said plurality of contact holes formed in a formation region of said relay electrode layer in a state of electrically connecting to said first relay electrode layer are arrayed so as to be adjacent one to another in said second direction.

6. An electro-optical device comprising:
   an electro-optical substance layer;
   a pair of substrates facing one another across said electro-optical substance layer so as to sandwich said electro-optical substance layer therebetween; and
   a layered structure formed on one of said substrates, said layered structure including
      scanning lines formed in a first direction, data lines formed in a second direction which intersects said first direction, pixel electrodes formed corresponding to intersection portions of said scanning lines and said data lines, transistors for controlling switching of said pixel electrodes, storage capacitors electrically connected to said pixel electrodes, and a fixed electrode layer for supplying a fixed potential to one electrode of said storage capacitors, said scanning lines, said data lines, said transistors, and said storage capacitors, being arrayed within a light shielding region disposed around said pixel electrodes;

wherein said pixel electrodes, and a semiconductor layer where said transistors are formed, are electrically connected via a first relay electrode layer at the same layer as said data line and a second relay electrode layer at the same layer as said fixed electrode layer;

and wherein said fixed electrode layer has light shielding properties, is discontinuous between adjacent data lines in said first direction, with said second relay electrode layer being formed at this discontinuous portion in a separated state from said fixed electrode layer;

and wherein the line width in said second direction of the portion of said fixed electrode layer extended in said first direction is set narrower than the line width in said second direction of said second relay electrode layer.

7. The electro-optical device according to claim 6, wherein two contact holes having different opening diameters are formed in the insulating films above and below said relay electrode layer;

and wherein said two contact holes are arrayed in said second direction with the contact hole of which the opening diameter is smaller in said first direction is disposed within a formation width of the contact hole of which the opening diameter is great.

8. The electro-optical device according to claim 6, wherein one electrode of said storage capacitor and said fixed electrode layer are electrically connected via a capacity relay electrode layer at the same layer as said data lines;

and wherein two contact holes having different opening diameters are formed in the insulating films above and below said capacity relay electrode layer;

and wherein said two contact holes are arrayed in said second direction with the contact hole of which the opening diameter is smaller in said first direction is disposed within a formation width of the contact hole of which the opening diameter is great.

9. An electro-optical device comprising:

an electro-optical substance layer;

a pair of substrates facing one another across said electro-optical substance layer so as to sandwich said electro-optical substance layer therebetween; and a layered structure formed on one of said substrates, said layered structure including scanning lines formed in a first direction, data lines formed in a second direction which intersects said first direction, pixel electrodes formed corresponding to intersection portions of said scanning lines and said data lines, transistors for controlling switching of said pixel electrodes, storage capacitors electrically connected to said pixel electrodes, and a fixed electrode layer for supplying a fixed potential to one electrode of said storage capacitors, said scanning lines, said data lines, said transistors, and said storage capacitors, being arrayed within a light shielding region disposed around said pixel electrodes;

wherein said pixel electrodes, and a semiconductor layer where said transistors are formed, are electrically connected via a first relay electrode layer at the same layer as said data lines and a second relay electrode layer at the same layer as said fixed electrode layer;

and wherein said fixed electrode layer has light shielding properties, is discontinuous between adjacent data lines in said first direction, with said second relay electrode layer being formed at this discontinuous portion in a separated state from said fixed electrode layer;

and wherein two contact holes having different opening diameters are formed in the insulating films above and below said capacity relay electrode layer;

and wherein said two contact holes are arrayed in said second direction with the contact hole of which the opening diameter is smaller in said first direction is disposed within a formation width of the contact hole of which the opening diameter is great.

10. An electro-optical device comprising:

an electro-optical substance layer;

a pair of substrates facing one another across said electro-optical substance layer so as to sandwich said electro-optical substance layer therebetween; and a layered structure formed on one of said substrates, said layered structure including scanning lines formed in a first direction, data lines formed in a second direction which intersects said first direction, pixel electrodes formed corresponding to intersection portions of said scanning lines and said data lines, transistors for controlling switching of said pixel electrodes, storage capacitors electrically connected to said pixel electrodes, and a fixed electrode layer for supplying a fixed potential to one electrode of said storage capacitors, said scanning lines, said data lines, said transistors, and said storage capacitors, being arrayed within a light shielding region disposed around said pixel electrodes;

wherein said pixel electrodes, and a semiconductor layer where said transistors are formed, are electrically connected via a first relay electrode layer at the same layer as said data lines and a second relay electrode layer at the same layer as said fixed electrode layer;

and wherein said fixed electrode layer has light shielding properties, is discontinuous between adjacent data lines in said first direction, with said second relay electrode layer being formed at this discontinuous portion in a separated state from said fixed electrode layer;

and wherein one electrode of said storage capacitor and said fixed electrode layer are electrically connected via a capacity relay electrode layer at the same layer as said data lines;

and wherein two contact holes having different opening diameters are formed in the insulating films above and below said capacity relay electrode layer;

and wherein said two contact holes are arrayed in said second direction with the contact hole of which the opening diameter is smaller in said first direction is disposed within a formation width of the contact hole of which the opening diameter is great.

* * * * *